(12) United States Patent
Tsorng et al.

(10) Patent No.: US 11,882,668 B2
(45) Date of Patent: Jan. 23, 2024

(54) DEVICE FOR SUPPORTING EXPANSION CARD

(71) Applicant: Quanta Computer Inc., Taoyuan (TW)

(72) Inventors: Yaw-Tzorng Tsorng, Taoyuan (TW); Ming-Lung Wang, Taoyuan (TW); Kai-Hsiang Chang, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 17/552,059

(22) Filed: Dec. 15, 2021

(65) Prior Publication Data

US 2023/0103941 A1    Apr. 6, 2023

Related U.S. Application Data

(60) Provisional application No. 63/261,993, filed on Oct. 1, 2021.

(51) Int. Cl.
*H05K 5/02* (2006.01)
*H05K 7/14* (2006.01)

(52) U.S. Cl.
CPC ......... *H05K 7/1435* (2013.01); *H05K 5/0221* (2013.01); *H05K 5/0286* (2013.01)

(58) Field of Classification Search
CPC ... H05K 7/1435; H05K 5/0221; H05K 5/0286
See application file for complete search history.

(56) References Cited

U.S. PATENT DOCUMENTS

| | | | |
|---|---|---|---|
| 7,209,365 B2 | 4/2007 | Chang | |
| 7,561,440 B2* | 7/2009 | Dai | H05K 7/1408 |
| | | | 361/740 |
| 7,649,752 B2* | 1/2010 | Tsorng | G06F 1/185 |
| | | | 361/802 |

(Continued)

FOREIGN PATENT DOCUMENTS

| | | | |
|---|---|---|---|
| CN | 104571383 B | | 1/2018 |
| CN | 214151592 U | * | 9/2021 |

OTHER PUBLICATIONS

Translation of CN-214151592-U (Year: 2021).*

(Continued)

*Primary Examiner* — Abhishek M Rathod
*Assistant Examiner* — Keith DePew
(74) *Attorney, Agent, or Firm* — NIXON PEABODY LLP

(57) ABSTRACT

A device comprises a riser board and a riser bracket. The riser board has a connector that receives an expansion card. The riser bracket is coupled to the riser board, and includes a body portion and a latch. The body portion is coupled to the riser board such that the body portion is spaced apart from the riser board connector. The latch is rotatably coupled to the body portion, and rotates between a first position and a second position. When the latch is in the first position and the expansion card is received by the riser board connector, the expansion card is removable from the riser board connector. When the latch is in the second position and the expansion card is received by the riser board connector, the latch engages the expansion card such that the expansion card is not removable from the riser board connector.

22 Claims, 6 Drawing Sheets

(56) References Cited

U.S. PATENT DOCUMENTS

| | | | |
|---|---|---|---|
| 8,797,764 B2* | 8/2014 | Bohannon | H05K 7/1489 |
| | | | 361/810 |
| 8,947,876 B2* | 2/2015 | Zhu | H05K 7/1487 |
| | | | 361/679.58 |
| 9,310,853 B2 | 4/2016 | Yu | |
| 10,303,226 B2* | 5/2019 | Chen | G06F 1/186 |
| 10,624,226 B1* | 4/2020 | Alvarado | H05K 7/1408 |
| 11,068,033 B2* | 7/2021 | Pena | G06F 1/185 |
| 11,442,498 B2* | 9/2022 | Jangili Ganga | G06F 13/4221 |
| 2002/0075638 A1* | 6/2002 | Chen | G06F 1/184 |
| | | | 361/679.6 |
| 2008/0165488 A1* | 7/2008 | Tsorng | G06F 1/185 |
| | | | 361/826 |
| 2012/0049027 A1* | 3/2012 | Chen | G06F 1/186 |
| | | | 248/309.1 |
| 2013/0027875 A1* | 1/2013 | Zhu | H05K 7/1487 |
| | | | 361/759 |
| 2016/0018859 A1* | 1/2016 | Mao | H05K 7/1405 |
| | | | 211/41.17 |
| 2021/0034097 A1* | 2/2021 | Jangili Ganga | G06F 13/4282 |

OTHER PUBLICATIONS

TW Office Action for Application No. 111106877, dated Jul. 28, 2022, w/ First Office Action Summary.
TW Search Report for Application No. 111106877, dated Jul. 28, 2022, w/ First Office Action.

* cited by examiner

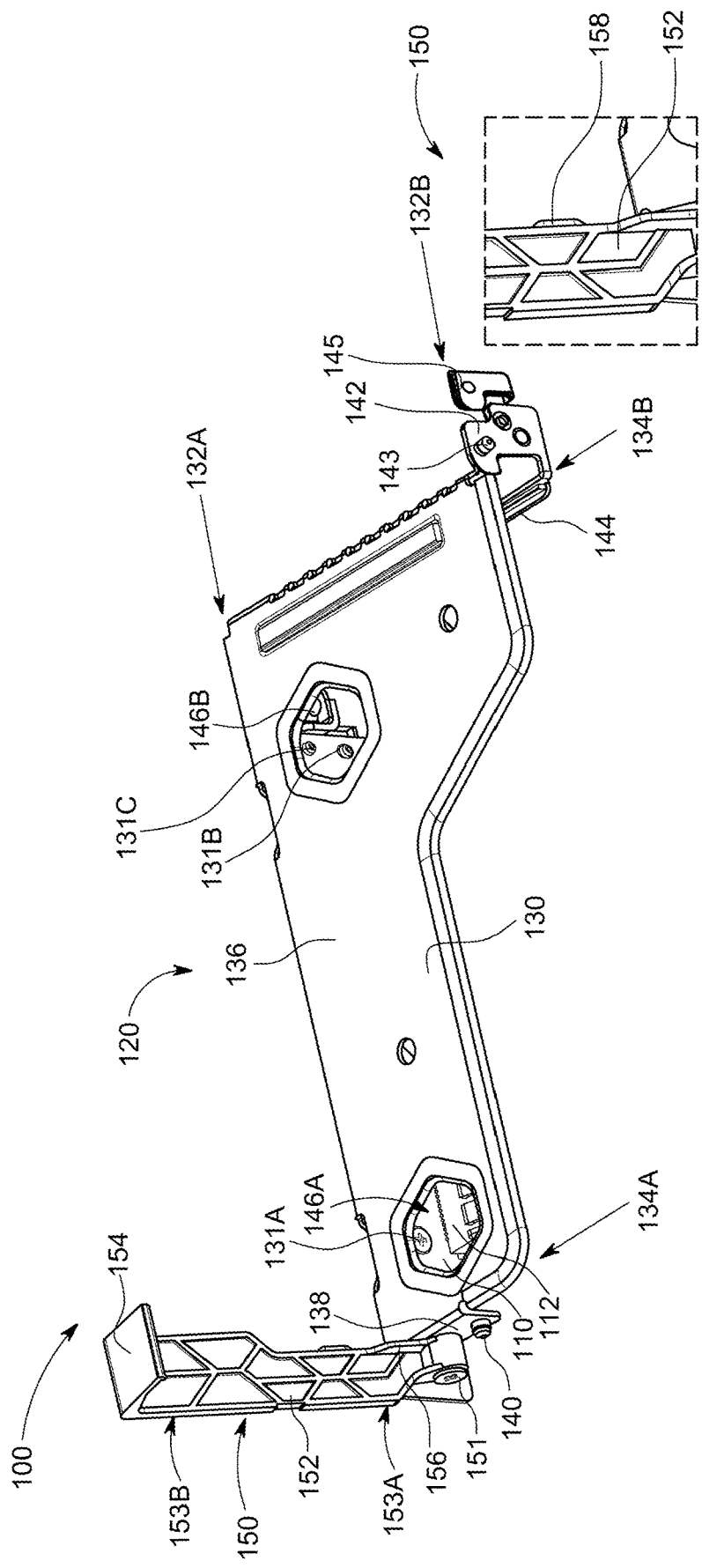

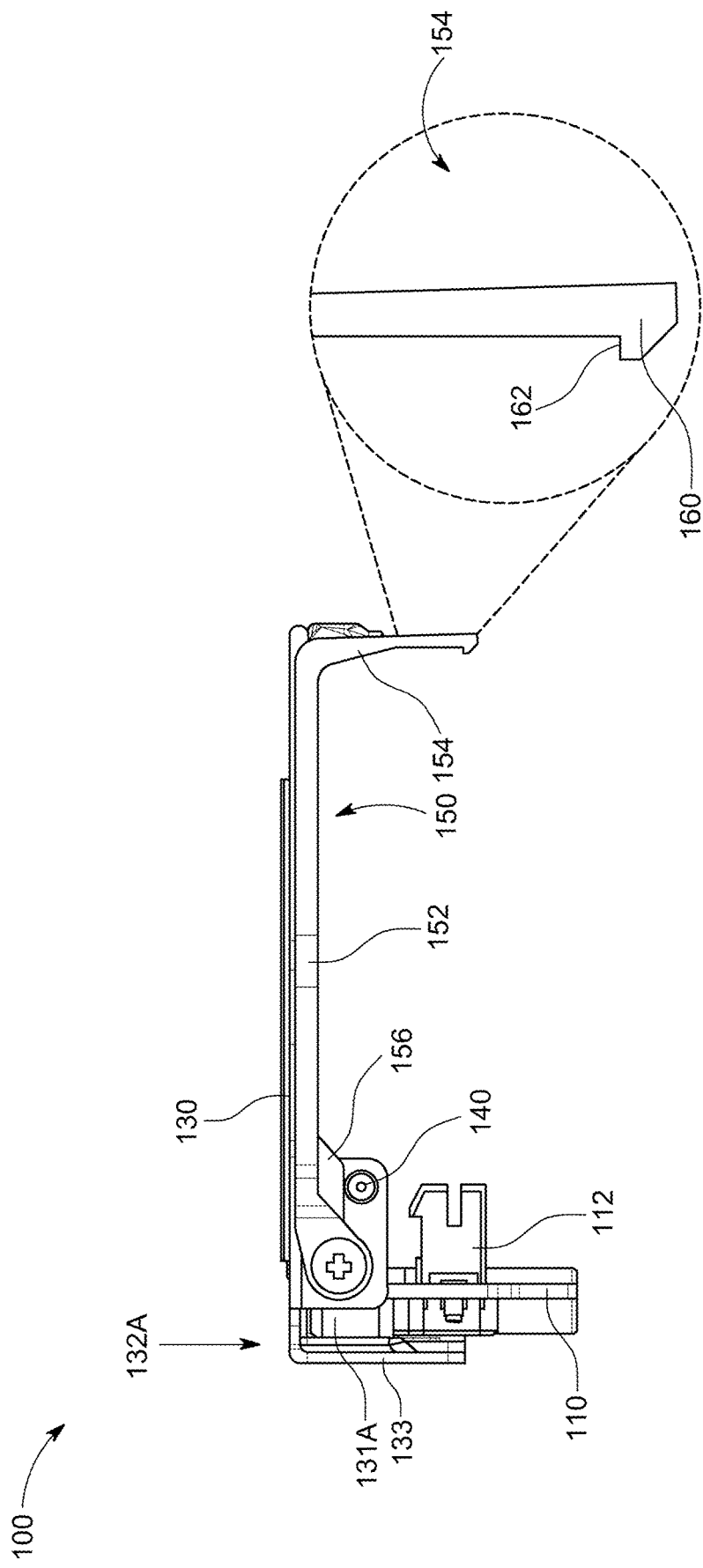

DEVICE FOR SUPPORTING EXPANSION CARD

CROSS-REFERENCE TO RELATED APPLICATIONS

This application claims priority from and benefit of U.S. Provisional Patent Application Ser. No. 63/261,993, filed on Oct. 1, 2021, titled "Holder Design For Preventing Expander Cards Drop Out," which is hereby incorporated by reference herein in its entirety.

FIELD OF THE INVENTION

The present invention relates generally to a device for supporting an expansion card, and more specifically, to a riser bracket configured to support an expansion card inserted into a riser board.

BACKGROUND OF THE INVENTION

Computing devices, such as servers, often have motherboards that include one or more connectors into which expansion cards can be inserted, to increase the functionality of the computing device. These connectors are often oriented vertically, which has led to the user of riser boards that can be inserted into the connectors. The riser boards have their own horizontally-oriented connectors, so that an expansion card can be connected to a motherboard in a horizontal orientation. However, when connected in such a manner, the side of the expansion card that is not inserted into the riser board connector can droop or sag due to gravity, which can lead to the expansion card inadvertently dropping out of the connector of the riser board. Thus, devices for supporting expansion cards are needed.

SUMMARY OF THE INVENTION

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to certain aspects of the present disclosure, a device for supporting an expansion card that is electrically connected to a motherboard comprises a riser board and a riser bracket. The riser board has a connector that is configured to receive the expansion card. The riser bracket is coupled to the riser board. The riser bracket includes a body portion and a latch. The body portion is coupled to the riser board such that the body portion is spaced apart from the riser board connector. The latch is rotatably coupled to the body portion, and is configured to rotate between a first position and a second position. When the latch is in the first position and the expansion card is received by the riser board connector, the expansion card is removable from the riser board connector. When the latch is in the second position and the expansion card is received by the riser board connector, the latch engages the expansion card such that the expansion card is not removable from the riser board connector.

In some implementations, the riser board connector is configured to receive the expansion card in a first direction. When the latch is in the second position, the latch prevents the expansion card from being removed from the riser board connector in a second direction that is parallel to and opposite of the first direction.

In some implementations, when the expansion card is received by the riser board connector, the body portion is spaced apart from the expansion card.

In some implementations, the latch includes a first leg and a second leg. The first leg is rotatably coupled to the body portion. The second leg extends from the first leg, and is generally perpendicular to the first leg.

In some implementations, the body portion includes a first side and a second side. Both the riser board and a proximal end of the first leg of the latch are coupled to the first side of the body portion.

In some implementations, the first leg of the latch extends away from the riser board and the first side of the body portion.

In some implementations, the second leg of the latch extends from a distal end of the first leg of the latch.

In some implementations, when the latch is in the second position and the expansion card is received by the riser board connector, the first leg of the latch is disposed above the expansion card, and the second leg of the latch extends toward the expansion card.

In some implementations, the latch includes a lip that extends from the second leg of the latch. The lip is generally perpendicular to the second leg such that the lip extends toward the proximal end of the first leg.

In some implementations, when the latch is in the second position and the expansion card is received by the riser board connector, a first edge of the expansion card is received by the riser board connector, and the lip of the latch is configured to engage a second edge of the expansion card.

In some implementations, the second edge of the expansion card is configured to rest on the lip of the latch, such that the expansion card is positioned between (i) the lip and the first leg, and (ii) at least a portion of the second leg and the riser board.

In some implementations, when the lip of the latch engages the second edge of the expansion card, the latch prevents the expansion card from being removed from the riser board connector.

In some implementations, when the lip of the latch engages the second edge of the expansion card, the latch prevents the second edge of the expansion card from sagging downward away from the body portion of the riser bracket.

In some implementations, the riser bracket further includes a stopper extending from the body portion. The stopper contacts the latch as the latch rotates from the first position.

In some implementations, the stopper prevents the latch from rotating past the second position.

In some implementations, the body portion of the riser bracket includes one or more openings defined therein. The riser board is accessible through the one or more openings.

In some implementations, the riser bracket further includes a rail coupled to and disposed beneath the body portion.

In some implementations, the rail is configured to support an edge of the expansion card in response to the riser board connector receiving the expansion card.

In some implementations, the latch includes a tab extending from the latch. The tab contacts the body portion in response to the latch moving between the first position and the second position.

In some implementations, the tab is configured to deform. When the tab deforms, the tab no longer contacts the body portion, and the latch can continue moving between the first position and the second position.

According to certain aspects of the present disclosure, a device comprises a riser board and a riser bracket. The riser board has a connector that is configured to receive an expansion card. The riser bracket is coupled to the riser board, and includes a body portion and a latch. The body portion is coupled to the riser board such that when the expansion card is received in the riser board connector, the body portion is spaced apart from the expansion card. The latch is coupled to the body. The latch is configured to engage the expansion card when the expansion card is received in the riser board connector, such that the expansion card is not removable from the riser board connector.

According to certain aspects of the present disclosure, a computing device comprises a chassis, a motherboard, an expansion card, and a device. The motherboard is disposed inside the chassis and includes a connector. The expansion card is disposed inside the chassis. The device is disposed inside the chassis, and is coupled to the motherboard. The device includes a riser board and a riser bracket. The riser board is inserted into the motherboard connector. The riser board has a connector that receives the expansion card. The riser bracket is coupled to the riser board, and includes a body portion and a latch. The body portion is coupled to the riser board and spaced apart from the expansion card. The latch is coupled to the body portion and is configured to engage the expansion card, such that the expansion card is not removable from the riser board connector.

In some implementations, the latch is rotatably coupled to the body portion and is configured to rotate between a first position and a second position. When the latch is in the first position, the expansion card is removable from the riser board connector. When the latch is in the second position, the expansion card is not removable from the riser board connector.

In some implementations, a first edge of the expansion card is received in the riser board connector. The latch engages a second opposing edge of the expansion card when the latch is in the second position, such that the expansion card is not removable from the riser board connector, and such that the second edge of the expansion card is prevented from sagging toward the motherboard.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

FIG. 1A is a perspective view showing a device for supporting an expansion card when a latch of the device is in a first position, according to certain aspects of the present disclosure.

FIG. 1B is a zoomed-in perspective view showing a tab of the latch of the device of FIG. 1A, according to certain aspects of the present disclosure.

FIG. 2A is a side view showing the device of FIG. 1A when the latch is in the second position, according to certain aspects of the present disclosure.

FIG. 2B is a zoomed-in view showing a lip of the latch of the device of FIG. 2A, according to certain aspects of the present disclosure.

DETAILED DESCRIPTION

Figure 3A:
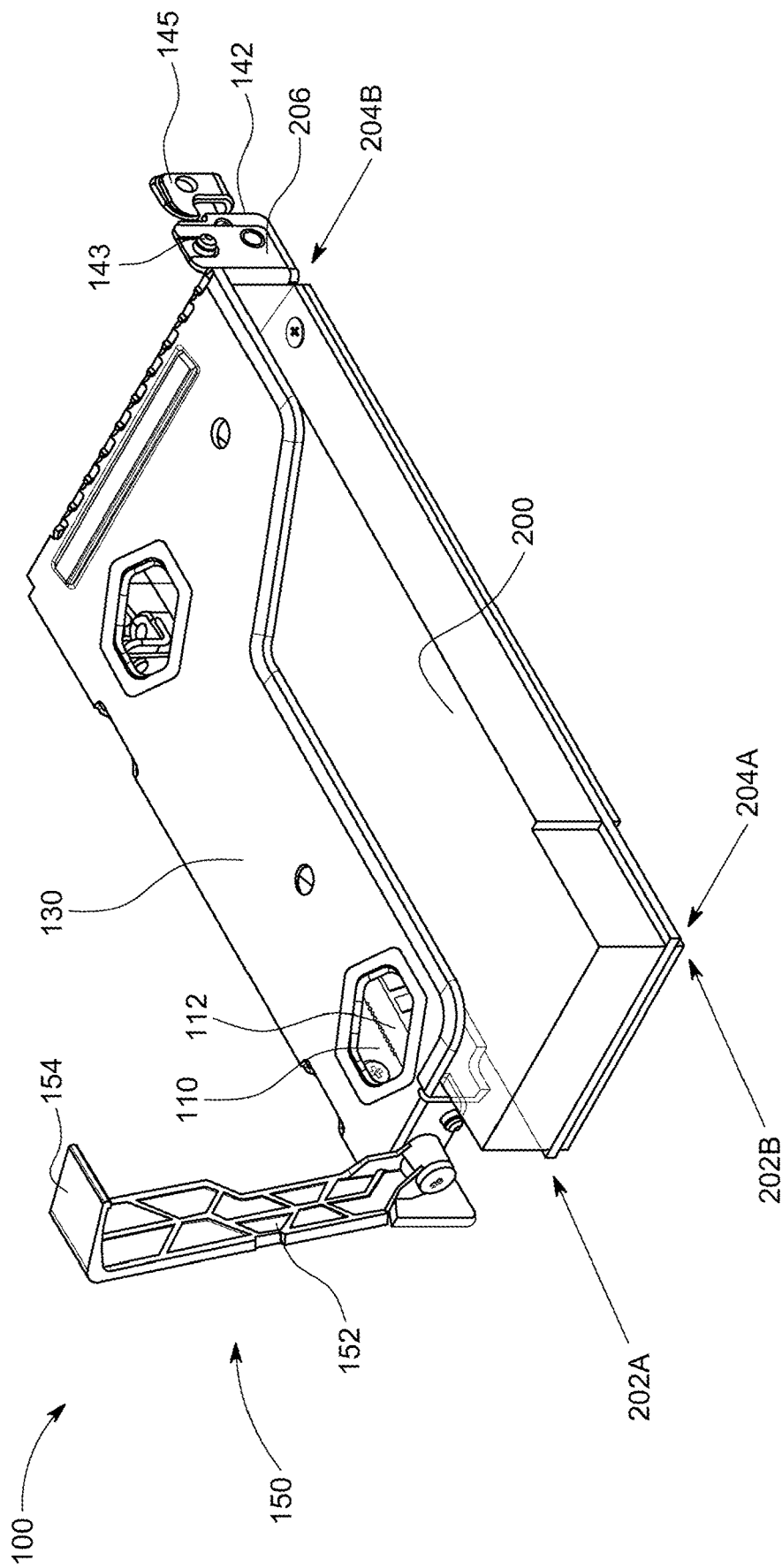
FIG. 3A is a perspective view showing an expansion card connected to the device of FIG. 1A when the latch is in the first position, according to certain aspects of the present disclosure.

Computing systems (such as servers) generally include a variety of different components disposed within a chassis. These components can include a motherboard with various different components electrically and/or physically coupled to the motherboard. These components can include central processing units (CPUs), graphics processing units (GPUs), memory devices (e.g., RAM, flash storage, etc.), a variety of different computer chips (e.g., a north bridge chip (also referred to as Northbridge or northbridge), a south bridge chip (also referred to as Southbridge or southbridge), etc.), input/output interfaces, power supplies, fan modules, etc. The motherboard can also include a connector mounted on the top surface of the motherboard that is configured to receive an expansion card therein. The connector is often oriented so that an expansion card received therein will be oriented perpendicular to the motherboard (e.g., vertically). A riser board is a board that can be inserted into the connector on the motherboard, and includes its own connector that can itself receive an expansion card. The riser board essentially repositions the connector of the motherboard to a more advantageous location and/or orientation. For example, the connector of the riser board will often be positioned above the motherboard (e.g., spaced apart from the motherboard), and oriented so that an expansion card received therein is positioned parallel to the motherboard (e.g., horizontally). Disclosed herein is a device that includes a riser board, and a riser bracket that is configured to support an expansion card that is received by the riser board.

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

FIG. 1A shows a device 100 for supporting an expansion card in a computing system. The device 100 includes a riser board 110 and a riser bracket 120. The riser board 110 includes a connector 112 (better shown in FIG. 2A). The connector 112 of the riser board 110 can also be referred to as the riser board connector. The riser board 110 can be inserted into a connector of a motherboard (not shown). The riser board 110 includes any necessary electrical traces and/or pathways to electrically connect the connector of the motherboard to the connector 112 of the riser board 110.

The riser bracket 120 includes a body portion 130 and a latch 150. The body portion 130 is coupled to the riser board 110. In the illustrated implementation, the body portion 130 is coupled to the riser board 110 via fasteners 131A-131C. The fasteners 131A-131C extend through both the body portion 130 and the riser board 110. The fasteners 131A-131C can be pins, screws, or any other suitable type of fastener. As can be seen in FIG. 1A, the riser board 110 is generally positioned underneath the body portion 130 of the riser bracket 120. Thus, the surface 136 of the body portion 130 generally forms an upper surface of the device 100 itself.

The body portion 130 of the riser bracket 120 includes a first side 132A, a second side 132B opposing the first side 132A, a third side 134A, and a fourth side 134B opposing the third side 134A. In the illustrated implementation, the riser board 110 is coupled to the riser bracket 120 along the first side 132A of the body portion 130. The body portion 130 includes a tab 138 located generally at the corner of the body portion 130 where the first side 132A and the third side 134A meet. The tab 138 is a portion of the body portion 130 that extends generally downward relative to the body portion 130. (e.g., in a direction toward the connector 112).

The body portion 130 also includes two openings 146A and 146B defined therein. The openings 146A and 146B are sized to allow a user to reach at least a finger through the openings 146A and 146B. During use of the device 100, the user can reach their fingers through the openings 146A and 146B in order to grasp the riser board 110 and/or the expansion card that is received by the connector 112, in order to insert the riser board 110 into the connector of the motherboard, or to remove the riser board 110 from the connector of the motherboard.

The latch 150 is rotatably coupled to the tab 138, for example by a fastener 151 that extends through the latch 150 and the tab 138. The fastener 151 could be a pin, a screw, or any other suitable type of fastener. The latch 150 is thus generally positioned at the corner of the body portion 130 where the first side 132A and the third side 134A meet. The latch 150 can rotate relative to the body portion 130 between a first position and a second position. In FIG. 1A, the latch 150 is in a first position, and extends generally perpendicular to the body portion 130. The latch 150 in the first position extends generally vertically relative to the plane of the page, and in the opposite direction from the body portion 130 as the riser board 110. When an expansion card is inserted into the connector 112 of the riser board 110 and the latch 150 is in the first position, the latch 150 does not contact the expansion card, and the expansion card is removable from a connector 112. When the latch 150 is moved to the second position, the latch 150 can engage the expansion card. When the latch 150 engages the expansion card, the expansion card is not removable from the connector 112 of the riser board 110, and the latch 150 prevents at least a portion of the expansion card from drooping or sagging downward toward the motherboard. Thus, the latch 150 prevents the expansion card from inadvertently being removed from the connector 112 of the riser board 110.

The latch 150 is formed from a first leg 152 and a second leg 154 that extends from the first leg 152. A proximal end 153A of the first leg 152 is coupled to the body portion 130, and extends away from both the first side 132A of the body portion 130, and the riser board 110. The second leg 154 extends from a distal end 153B of the first leg 152, and is generally perpendicular to the first leg 152. When the latch 150 is in the first position as shown in FIG. 1A, the first leg 152 is perpendicular to the body portion 130 and the second leg 154. In turn, the second leg 154 is spaced apart from the body portion 130 (e.g., is above the body portion 130 relative to the plane of FIG. 1A), and is parallel to the body portion 130. The latch 150 is generally made from a resilient material (e.g., a material that can be flexed, compressed, deformed, etc., and will then return to its original position). Thus, various portions of the latch 150 can flex or compress flex relative to each other. For example, the second leg 154 can be flexed (for example by a user) relative to the first leg 152 so that the second leg 154 is temporarily not perpendicular to the first leg 152. After the force causing the flexing is removed, the second leg 154 will generally return to its perpendicular position relative to the first leg 152.

The riser bracket 120 further includes a stopper 140 that protrudes from the body portion 130. The stopper 140 contacts the latch 150 as the latch 150 moves from the first position to the second position. As shown in FIG. 1A, the stopper 140 extends from the tab 138, away from the third side 134A and the fourth side 134B. The latch 150 includes a ridge 156 extending from the underside of the first leg 152, generally in the same direction that the second leg 154 extends from the first leg 152. When the latch 150 reaches the second position, the ridge 156 contacts the stopper 140, and the latch 150 is thus prevented from moving any further than the second position.

FIG. 1B shows a zoomed-in view of the latch 150. As shown, the latch 150 includes a tab 158 that extends from the first leg 152. The tab 158 extends in a direction toward the fourth side 134B of the body portion 130. The tab 158 also extends past the third side 134A. Thus, as the latch 150 is moved between the first position and the second position (for example by a user or technician), the tab 158 will contact the edge of the body portion 130 at the third side 134A, and temporarily prevent the latch 150 from moving any further. However, as the user continues to impart force on the latch 150 to move the latch 150 between the first position and the second position, the tab 158 will deform or compress slightly, so that the latch 150 no longer contacts the body portion 130, and the latch 150 can continue to be moved between the first position and the second position. The tab 158 can thus prevent the latch 150 from inadvertently moving between the first position and the second position without the user intending to cause such movement. Generally, the force required to deform the latch 150 will be greater than the force imparted on the latch 150 due to inadvertent movement (e.g., movement not intended to move the latch 150 from the first position to the second position, or from the second position to the first position).

Referring back to FIG. 1A, the riser bracket 120 further includes a tab 142 that extends from the body portion 130, and a rail 144 that is coupled to the tab 142. The tab 142 is formed at the corner of the body portion 130 where the second side 132B and the fourth side 134B meet. The tab 142 extends in a first direction away from the third side 134A and the fourth side 134B (e.g., generally rightward relative to the plane of FIG. 1A). The tab 142 also extends in a second direction away from the third side 134A and the fourth side 134B (e.g., generally downward relative to the plane of FIG. 1A). The tab 142 includes a protrusion 143 and a movable cover piece 145. The protrusion 143 extends from the tab 142 outward away from the body portion 130. The cover piece 145 is movably coupled to the tab 142 and can move between various different positions. In FIG. 1A, the cover piece 145 is in an open position where it generally extends away from the tab 142. In some implementations, the cover piece 145 is rotatably coupled to the tab 142, and thus rotates between various positions. However, in other implementations, the cover piece 145 is coupled to the tab 142 in a different manner, and moves in a different manner between positions. As is explained in more detail herein, the tab 142, the protrusion 143, and the cover piece 145 can aid in securing an expansion card in place.

The rail 144 extends from the lower end of the tab 142 (at the second side 132B of the body portion 130) and toward the first side 132A of the body portion 130. At the first side 132A, the rail 144 is connected to the body portion 130. In some implementations, the body portion 130 may include an additional tab formed at the corner of the body portion 130 where the first side 132A and the fourth side 134B meet. The rail 144 can be coupled to this additional tab. In other implementations, the rail 144 terminates in a vertical piece that connects the rail 144 to the first side 132A of the body portion 130. Thus, the rail 144 is generally parallel to the fourth side 134B of the body portion 130, but is positioned underneath the body portion 130. During use of the device 100, the rail 144 can be used to support an edge of the expansion card and aid in preventing the expansion card from drooping or sagging.

FIG. 2A shows a side view of the device 100 when the latch 150 is in the second position. As can be seen in more detail, the riser board 110 and the connector 112 are positioned underneath the body portion 130. The body portion 130 includes a side portion 133 that is formed at the first side 132A. The side portion 133 extends downwardly (e.g., from the top surface of the body portion 130 in a direction toward the connector 112). The fastener 131A extends through the riser board 110 and at least partially through the side portion 133 to couple the riser board 110 to the body portion 130.

When the latch 150 is in the second position, the first leg 152 is generally parallel to the body portion 130, and is positioned above the connector 112 of the riser board 110 relative to the plane of FIG. 2A. The second leg 154 extends from the first leg 152 so that the second leg 154 is perpendicular to the first leg 152 (e.g., the second leg 154 extends downward relative to the plane of FIG. 2A). When the latch 150 is in the second position, the stopper 140 contacts the ridge 156 of the first leg 152, which prevents the latch 150 from rotating past the second position.

FIG. 2B shows a zoomed-in view of a distal end of the second leg 154. As shown, the second leg 154 includes a lip 160 that extends from the second leg 154, such that the lip 160 is generally perpendicular to the second leg 154. The lip 160 generally extends back toward the connection between the body portion 130 and the latch 150. Thus, the lip 160 extends toward (i) the riser board 110, (ii) the first side 132A of the body portion 130, and (iii) the proximal end 153A of the first leg 152. The lip 160 forms an upper surface 162 which, as is discussed in more detail herein, is configured to support an edge of an expansion card that is inserted into the connector 112 of the riser board 110, when the latch 150 is in the second position.

FIG. 3A shows the device 100 when an expansion card 200 is received by the connector 112 of the riser board 110, and the latch 150 is in the first position. The first leg 152 of the latch 150 extends upward away from the body portion 130 and the expansion card 200. The second leg 154 of the latch 150 is spaced apart from the body portion 130 and the expansion card 200. The body portion 130 is spaced apart from the expansion card 200 (e.g., is positioned above the expansion card 200). A first edge 202A of the expansion card 200 is inserted into the connector 112. Generally, the expansion card 200 will include one or more connectors along the first edge 202A (such as gold finger connectors) that are received by the connector 112. A second edge 202B and a third edge 204A of the expansion card 200 are both unsupported. A fourth edge 204B of the expansion card 200 slides along the rail 144 (shown in FIG. 1A). The rail 144 thus supports the expansion card 200 when the expansion card 200 is received by the connector 112 of the riser board 110. The rail 144 can aid in preventing the expansion card 200 (or at least the fourth edge 204B of the expansion card 200) from drooping or sagging downward (for example due to gravity). The expansion card 200 includes a tab 206 that corresponds to tab 142 of the body portion 130. As shown in FIG. 3A, when the expansion card 200 is received by the connector 112, the protrusion 143 of the tab 142 is received within a groove that is defined in the tab 206. Because the latch 150 in the first position does not engage the expansion card 200, and because the cover piece 145 remains in the open position, the expansion card 200 is removable from the connector 112 of the riser board 110.

Figure 3B:
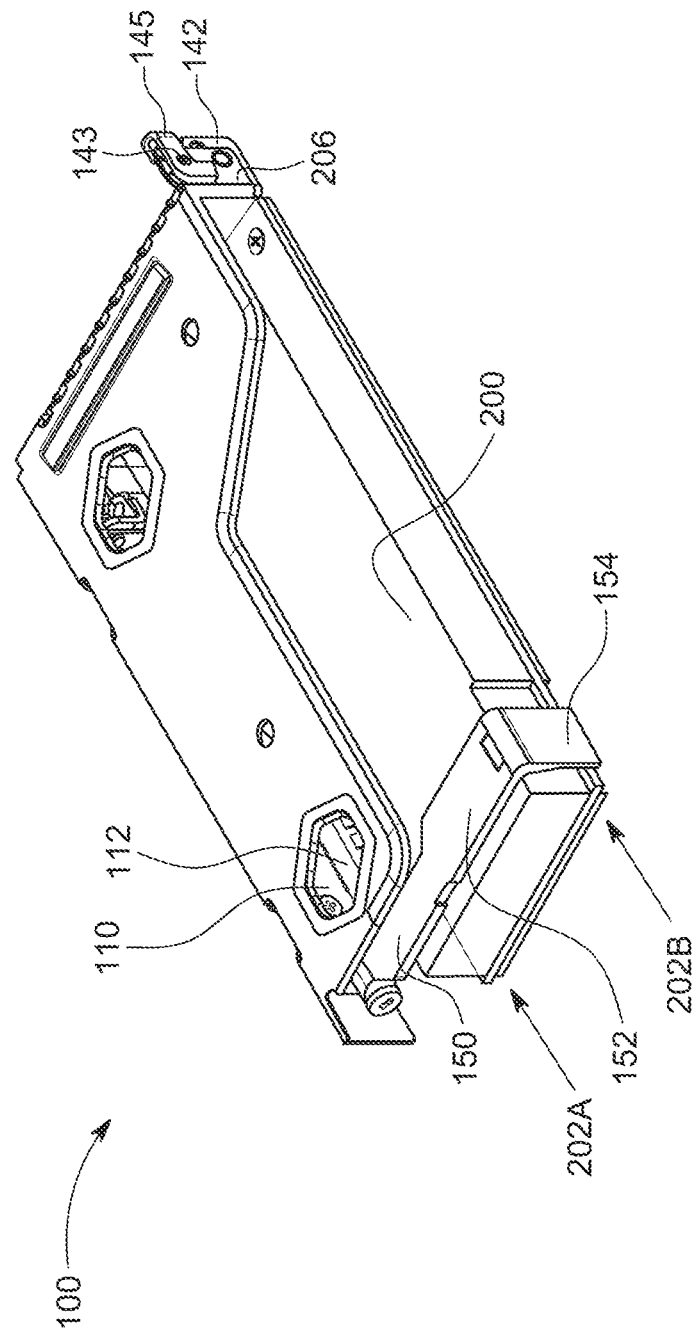
FIG. 3B is a perspective view showing the expansion card connected to the device of FIG. 1A when the latch is in the second position, according to certain aspects of the present disclosure.

FIG. 3B shows the device 100 of FIG. 3A when the latch 150 is in the second position. After the expansion card 200 is inserted into the connector 112, the latch 150 can be rotated toward the second position in order to engage the expansion card 200. The latch 150 is made from a resilient material, and thus the second leg 154 can be bent slightly outward (for example by a user) to allow the distal end of the second leg 154 to travel past the second edge 202B of the expansion card 200. The second leg 154 is then allowed to return to its normal position (e.g., perpendicular to the first leg 152), so that the latch 150 can engage the expansion card 200.

When the latch 150 is in the second position, the first leg 152 of the latch 150 is spaced apart from the expansion card 200 (e.g., is disposed above the expansion card 200). The first leg 152 spans the width of the expansion card 200 from the first edge 202A to the second edge 202B. Because the first leg 152 is spaced apart from the expansion card 200, the second leg 154 of the latch 150 extends downward toward the expansion card 200. The lip 160 (FIG. 2B) of the latch 150 engages the second edge 202B of the expansion card 200. As is discussed in more detail herein, when the lip 160 engages the expansion card 200, the latch 150 blocks the expansion card 200, such that the expansion card 200 is not removable from the connector 112 of the riser board 110. The latch 150 also aids in preventing the expansion card 200 (e.g., the second edge 202B) from drooping or sagging downward when the lip 160 engages the expansion card 200.

FIG. 3B shows the cover piece 145 rotated to a closed position where it covers the tab 142 and the tab 206. In this arrangement, the tab 206 of the expansion card 200 is positioned between the tab 142 and the cover piece 145. The protrusion 143 extends through an opening in the cover piece 145, so that the cover piece 145 cannot inadvertently rotate back to the open position. The presence of the cover piece 145 aids in preventing the expansion card 200 from being removed from the connector 112. And because the protrusion 143 extends through the opening in the cover piece 145, the cover piece 145 cannot inadvertently rotate back to the open position.

Figure 3D:
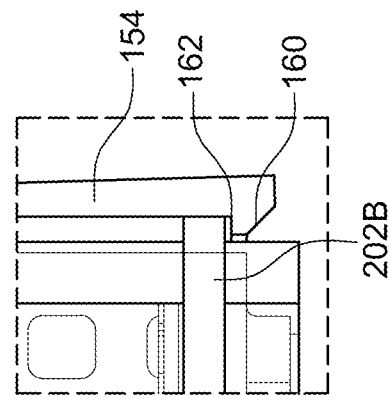
FIG. 3D is a zoomed-in side view showing the engagement between the expansion card and the latch of the device of FIG. 3B, according to certain aspects of the present disclosure.
Figure 3C:
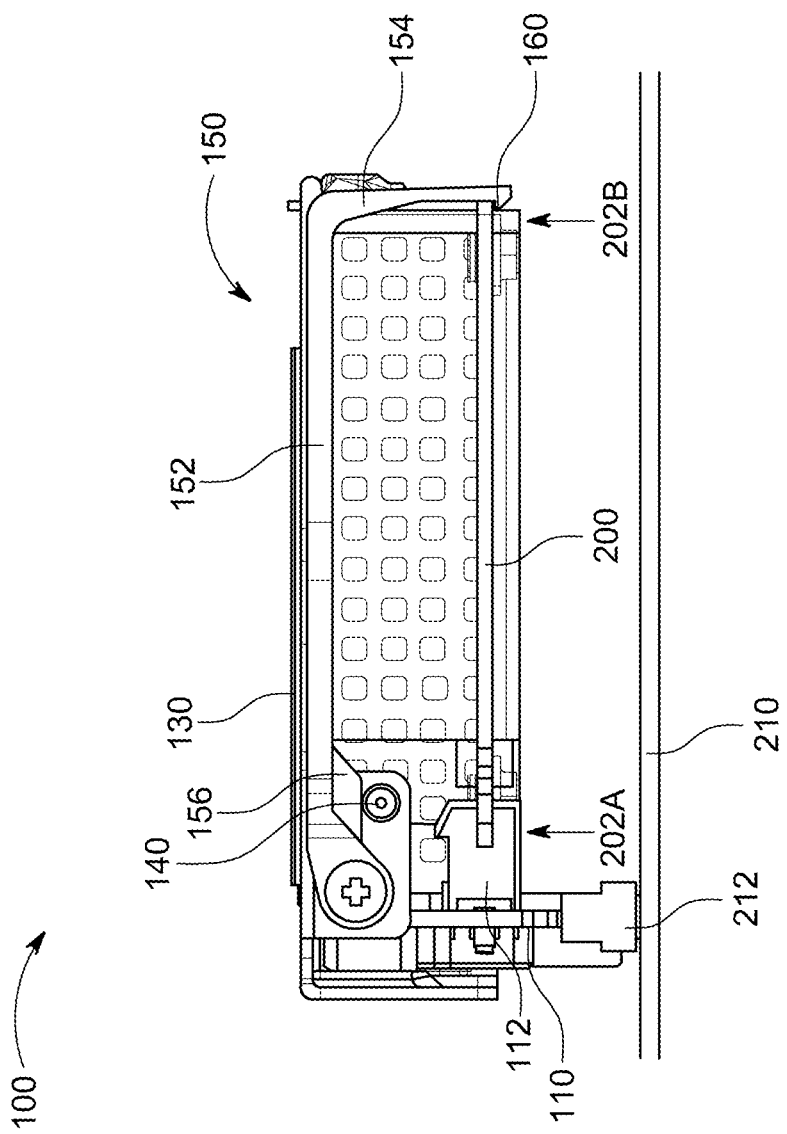
FIG. 3C is a side view showing the device of FIG. 3B, according to certain aspects of the present disclosure.

FIG. 3C shows the device 100 of FIG. 3B in combination with a motherboard 210 that includes a connector 212. The connector 212 of the motherboard 210 can also be referred to as the motherboard connector. In FIG. 3C, the riser board 110 is inserted into the connector 212 of the motherboard 210 along a first direction that is leftward relative to the plane of FIG. 3C. Generally, the motherboard 210 will be a component of a computing system (such as a server). The motherboard 210, the device 100, and the expansion card 200 will be located within a chassis of the computing system. The connector 112 and the expansion card 200 are spaced apart from the motherboard 210 (e.g., are disposed above the motherboard 210 relative to the plane of FIG. 3C), such that an open space exists between the motherboard 210 and the expansion card 200. Other components of the motherboard 210 (e.g., processors, memory devices, etc.) may be disposed in this open space. The riser board 110 thus allows the expansion card 200 to be positioned parallel to the motherboard 210, and to not interfere with any other components on the motherboard 210 that may extend upward from the motherboard 210.

In FIG. 3C, the latch 150 is in the second position. Contact between the stopper 140 and the ridge 156 of the first leg 152 of the latch 150 prevents the latch 150 from rotating past the second position. The body portion 130 and the first leg 152 of the latch 150 are spaced apart from the connector 112 and the expansion card 200 (e.g., are positioned above the connector 112 and the expansion card 200 relative to the plane of FIG. 3C), such that an open space is defined therebetween. Thus, if the expansion card 200 includes any components that extend upward, the body portion 130 and the latch 150 will not contact these components. As shown, the first edge 202A of the expansion card 200 is received by the connector 112 of the riser board 110. The second edge 202B of the expansion card 200 is engaged by the lip 160 of the latch 150 that extends from the second leg 154.

FIG. 3D shows a zoomed-in view of FIG. 3C that illustrates details of the engagement between the lip 160, and the second edge 202B of the expansion card 200. The second edge 202B rests on the upper surface 162 that is formed by the lip 160. The second edge 202B is thus positioned between (i) the lip 160, and (ii) the first leg 152 of the latch 150 (as shown in FIG. 3C). Because the latch 150 cannot rotate any further due to the contact between the stopper 140 and the ridge 156 (FIG. 3C), the lip 160 of the latch 150 holds up the second edge 202B of the expansion card 200. The latch 150 thus aids in preventing the second edge 202B from drooping or sagging downward toward the motherboard 210 and away from the body portion 130 (e.g., due to gravity).

Referring back to FIG. 3C, the expansion card 200 is also positioned between (i) the connector 112 of the riser board 110 and (ii) a portion of the second leg 154 of the latch 150, because the second leg 154 extends past and underneath the second edge 202B. The latch 150 thus blocks the expansion card 200 from moving, such that the expansion card 200 is not removable from the connector 112. The latch 150 thus aids in preventing the expansion card 200 from inadvertently being pulled out of the connector 112 in a second direction (e.g., rightward relative to the plane of FIG. 3C) opposite than the first direction along which the expansion card 200 was inserted into the connector 112. Any movement of the expansion card 200 in the second direction would cause the expansion card 200 to press against the second leg 154. Because the latch 150 is coupled to the body portion 130, and the body portion 130 is connected to the motherboard 210 via the riser board 110, the latch 150 holds the expansion card 200 in place.

As noted herein, the latch 150 is made from a resilient material. Thus, to remove the expansion card 200 from the connector 112, the second leg 154 can be flexed outward away from the expansion card 200. In this position, the lip 160 is no longer supporting the second edge 202B of the expansion card 200, and the latch 150 can be rotated away from the second position. Once the second leg 154 of the latch 150 is no longer preventing movement of the expansion card 200, the expansion card 200 is removable and can be removed from the connector 112.

While FIGS. 3C and 3D show the lip 160 engaging the expansion card 200 by providing the upper surface 162 on which the second edge 202B of the expansion card 200 can rest, this engagement can occur in other manners. For example, in some implementations, the latch 150 may include one or more fasteners that are configured to temporarily grasp the expansion card 200.

Further, while FIGS. 1A and 3A show that the first leg 152 of the latch 150 is perpendicular to the body portion 130 when the latch 150 is in the first position, other positions of the latch 150 may be considered to be the first position. Generally, the first position is any position of the latch 150 where the latch 150 does not engage the expansion card 200 and/or prevent movement of the expansion card 200.

In the illustrated implementation, the interlocking tabs 142 and 206 help secure the expansion card 200 to the body portion 130 along the side 134B of the body portion 130. However, other mechanisms or techniques could be used in other implementations. The expansion card 200 and/or the body portion 130 can have any sort of mating features that interact with each other to aid in securing the expansion card 200 to the body portion 130, such as snaps, screws, clips, etc.

Figure 4:
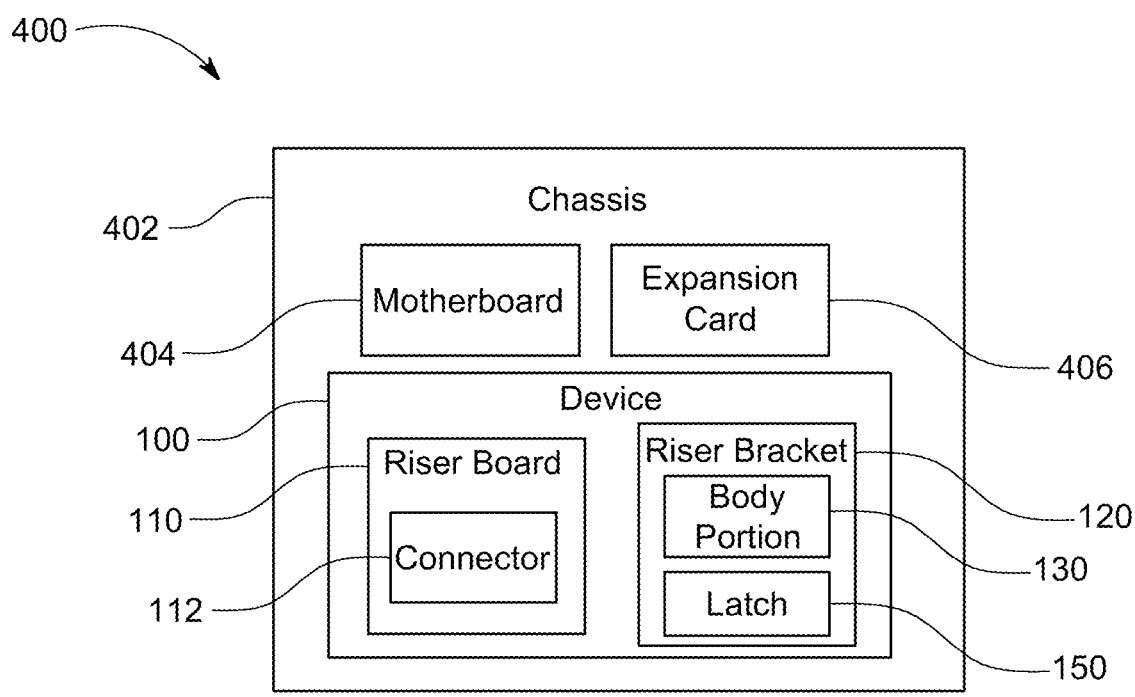
FIG. 4 is a block diagram of a computing system using the device of FIG. 1A, according to certain aspects of the present disclosure.

FIG. 4 shows a block diagram of an example computing system 400 that can be used with the device 100. The computing system 400 includes a chassis 402, a motherboard 404 disposed inside the chassis 402, an expansion card 406 disposed inside the chassis 402, and the device 100 disposed inside the chassis 402. The motherboard 404 can be the same as or similar to the motherboard 210 in FIG. 3C. The expansion card 406 can be the same as or similar to the expansion card 200 in FIGS. 3A-3D. The computing system 400 may include one or more additional components disposed inside the chassis 402. These other components can include components disposed on the motherboard 404, components not disposed on the motherboard 404 but otherwise electrically connected to the motherboard 404, or any combination thereof.

The device 100 is coupled to the motherboard 404, and includes the riser board 110 and the riser bracket 120. The riser board 110 includes the connector 112, and the riser bracket 120 includes the body portion 130 and the latch 150. As discussed herein, when the latch 150 is in its first position, the expansion card 406 is removable from the connector 112 of the riser board 110. When the latch 150 is in its second position, the latch 150 engages the expansion card 406 such that the expansion card 406 is not removable from the connector 112 of the riser board 110. The latch 150 in its second position also supports the expansion card 406 and prevents the expansion card 406 from drooping or sagging downward toward the motherboard 404, for example due to gravity. Thus, the latch 150 can be used to prevent the expansion card 406 from being inadvertently removed from the motherboard 404.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A device for supporting an expansion card electrically connected to a motherboard, the device comprising:

a riser board having a riser board connector that is configured to receive the expansion card, the riser board being configured to be inserted into a motherboard connector of the motherboard such that the riser board is perpendicular to the motherboard, the riser board being perpendicular to the expansion card when a first edge of the expansion card is received by the riser board connector; and a riser bracket coupled to the riser board, the riser bracket including:

a body portion coupled to the riser board such that the body portion is spaced apart from the riser board connector; and a latch rotatably coupled to the body portion, the latch being configured to rotate between a first position and a second position, the latch having a first leg rotatably coupled to the body portion, a second leg extending perpendicularly from a distal end of the first leg, and a lip extending perpendicularly from a distal end of the second leg toward the first leg, wherein when the latch is in the first position and the first edge of the expansion card is received by the riser board connector, the expansion card is removable from the riser board connector, and wherein when the latch is in the second position and the first edge of the expansion card is received by the riser board connector, the first leg of the latch is perpendicular to the riser board and the second leg of the latch is parallel to the riser board, and the latch engages an opposing second edge of the expansion card such that at least a portion of the second edge of the expansion card rests on the lip of the latch and is positioned between the first leg of the latch and the lip, such that the riser board and the second leg of the latch are positioned on opposite sides of the expansion card, and such that the expansion card is not removable from the riser board connector.

2. The device of claim 1, wherein the riser board connector is configured to receive the expansion card in a first direction, and wherein when the latch is in the second position, the latch prevents the expansion card from being removed from the riser board connector in a second direction that is parallel to and opposite of the first direction.

3. The device of claim 1, wherein when the expansion card is received by the riser board connector, the body portion is spaced apart from the expansion card.

4. The device of claim 1, wherein when the latch is in the second position and the expansion card is received by the riser board connector, the first leg of the latch is spaced apart from the expansion card, and the second leg of the latch extends toward the expansion card.

5. The device of claim 1, wherein the body portion includes a first side and a second side, and wherein both the riser board and a proximal end of the first leg of the latch are coupled to the first side of the body portion.

6. The device of claim 1, wherein when the latch is in the second position and the first edge of the expansion card is received by the riser board connector, the expansion card is positioned between (i) at least a portion of the second leg and (ii) the riser board.

7. The device of claim 6, wherein when the lip of the latch engages the second edge of the expansion card, the latch prevents the expansion card from being removed from the riser board connector.

8. The device of claim 6, wherein when the lip of the latch engages the second edge of the expansion card, the latch prevents the second edge of the expansion card from sagging downward away from the body portion of the riser bracket.

9. The device of claim 1, wherein the riser bracket further includes a stopper extending from the body portion, the stopper contacting the latch as the latch rotates from the first position such that the stopper supports at least a portion of a combined weight of the latch and the expansion card, and prevents the second edge of the expansion card from sagging away from the body portion of the riser bracket.

10. The device of claim 1, wherein the riser bracket further includes a rail coupled to and disposed beneath the body portion, the rail being configured to support an edge of the expansion card in response to the riser board connector receiving the expansion card.

11. The device of claim 1, wherein the latch includes a tab extending from the latch, the tab contacting the body portion in response to the latch moving between the first position and the second position.

12. The device of claim 11, wherein the tab is configured to deform such that the tab does not contact the body portion, and the latch can continue moving between the first position and the second position.

13. The device of claim 1, wherein the portion of the second edge of the expansion card rests directly on the lip of the latch.

14. The device of claim 1, wherein the lip of the latch forms a generally flat upper surface extending from the second leg, the portion of the second edge of the expansion card resting on top of the upper surface of the lip to prevent the second edge of the expansion card from moving away from the second leg of the latch due to gravity.

15. The device of claim 14, wherein the upper surface of the lip extends along an entire width of the second leg of the latch.

16. The device of claim 14, wherein the second leg extends in a first direction from the first leg, and wherein the upper surface lip faces in a second direction toward the first leg that is parallel and opposed to the first direction.

17. The device of claim 14, wherein when the latch is in the second position and the first edge of the expansion card is received by the riser board connector, the first leg and the upper surface of the lip are disposed on opposite sides of the expansion card.

18. The device of claim 1, wherein when the riser board is inserted into the motherboard connector the first edge of the expansion card is received by the riser board connector, the expansion card is positioned between the motherboard and the body portion of the riser bracket.

19. The device of claim 1, wherein when the riser board is inserted into the motherboard connector, the first edge of the expansion card is received by the riser board connector, and the latch is in the second position, the first leg of the latch and the motherboard are positioned on opposite sides of the expansion card.

20. The device of claim 1, wherein when the riser board is inserted into the motherboard connector, the first edge of the expansion card is received by the riser board connector, and the latch is in the second position, the lip of the latch and the motherboard are positioned on the same side of the expansion card.

21. The device of claim 1, wherein when the riser board is inserted into the motherboard connector and the latch is in the second position, the first leg of the latch is parallel to the motherboard and the second leg of the latch is perpendicular to the motherboard.

22. A computing device comprising:
a chassis;
a motherboard disposed inside the chassis, the motherboard including a motherboard connector;
an expansion card disposed inside the chassis; and
a device disposed inside the chassis and coupled to the motherboard, the device including:
a riser board inserted into the motherboard connector such that the riser board is perpendicular to the motherboard, the riser board having a riser board connector that receives a first edge of the expansion card such that the riser board is perpendicular to the expansion card and the expansion card is parallel to the motherboard; and
a riser bracket coupled to the riser board, the riser bracket including a body portion and a latch rotatable between a first position and a second position, the body portion being coupled to the riser board and spaced apart from the expansion card, the latch having a first leg rotatably coupled to the body portion, a second leg extending perpendicularly from a distal end of the first leg, and a lip extending perpendicularly from a distal end of the second leg toward the first leg,
wherein when the latch is in the first position, the expansion card is removable from the riser board connector, and
wherein when the latch is in the second position, the first leg of the latch is perpendicular to the riser board and the second leg of the latch is parallel to the riser board, and the latch engages an opposing second edge of the expansion card such that at least a portion of the second edge of the expansion card rests on the lip and is positioned between the first leg of the latch and the lip, such that the riser board and the second leg of the latch are positioned on opposite sides of the expansion card, and such that the expansion card is not removable from the riser board connector.

\* \* \* \* \*